(12) United States Patent
Leonard

(10) Patent No.: US 10,068,611 B2
(45) Date of Patent: *Sep. 4, 2018

(54) SYSTEMS AND METHODS FOR DYNAMIC AUDIO PROCESSING

(71) Applicant: Colin Leonard, Marietta, GA (US)

(72) Inventor: Colin Leonard, Marietta, GA (US)

(*) Notice: Subject to any disclaimer, the term of this patent is extended or adjusted under 35 U.S.C. 154(b) by 163 days.

This patent is subject to a terminal disclaimer.

(21) Appl. No.: 15/188,795

(22) Filed: Jun. 21, 2016

(65) Prior Publication Data

US 2016/0336911 A1  Nov. 17, 2016

Related U.S. Application Data

(63) Continuation of application No. 14/224,009, filed on Mar. 24, 2014, now Pat. No. 9,449,082, which is a
(Continued)

(51) Int. Cl.
| | |
|---|---|
| *G11B 27/00* | (2006.01) |
| *G11B 20/10* | (2006.01) |
| *H03G 3/00* | (2006.01) |
| *G10L 21/043* | (2013.01) |
| *H03G 5/02* | (2006.01) |
| *G06F 3/16* | (2006.01) |

(Continued)

(52) U.S. Cl.
CPC ............ *G11B 27/005* (2013.01); *G06F 3/162* (2013.01); *G06F 17/3074* (2013.01); *G10L 21/043* (2013.01); *G11B 20/10018* (2013.01); *G11B 27/031* (2013.01); *H03G 3/002* (2013.01); *H03G 5/02* (2013.01); *H04R 3/04* (2013.01); *G10L 21/04* (2013.01); *H04R 2430/01* (2013.01)

(58) Field of Classification Search
CPC ................ G11B 27/005; G11B 27/031; G11B 20/10018; G06F 3/16; G06F 3/162; G06F 3/165
USPC ........ 700/94; 704/500, 503; 381/98; 360/26, 360/51, 73.01, 73.02; 84/605; 710/60
See application file for complete search history.

(56) References Cited

U.S. PATENT DOCUMENTS

| | | | | |
|---|---|---|---|---|
| 4,275,268 A | * | 6/1981 | Takahashi | ............... H04H 60/04 381/119 |
| 4,277,796 A | * | 7/1981 | Ross | ...................... G11B 3/702 369/60.01 |

(Continued)

OTHER PUBLICATIONS

Elbin, Jesse, "NonFinal OA", U.S. Appl. No. 14/224,009, filed Mar. 24, 2014, dated Nov. 30, 2015.
(Continued)

*Primary Examiner* — Jesse A Elbin
(74) *Attorney, Agent, or Firm* — Philip H. Burrus, IV

(57) ABSTRACT

Systems and methods presented herein may provide for processing audio with increased loudness and dynamics. A first clock frequency associated with a digital audio file may be increased to a second clock frequency, which speeds up the playback of the audio. The digital audio file may then be converted to analog at the higher second frequency, where it is further modified in the analog domain. The analog audio is then converted back into digital audio at the second clock frequency. The clock frequency is then decreased back to the first clock frequency for playback or storage of the processed (i.e., modified or manipulated) digital audio file. Alternatively, the entire process can take place in the digital domain.

20 Claims, 7 Drawing Sheets

Related U.S. Application Data continuation of application No. 13/209,368, filed on Aug. 13, 2011, now Pat. No. 8,682,462.

(51) Int. Cl.
  *G11B 27/031* (2006.01)
  *G06F 17/30* (2006.01)
  *H04R 3/04* (2006.01)
  *G10L 21/04* (2013.01)

(56) References Cited

U.S. PATENT DOCUMENTS

| | | | | |
|---|---|---|---|---|
| 4,410,917 | A | * | 10/1983 | Newdoll ............ G11B 5/86 360/15 |
| 4,462,050 | A | * | 7/1984 | Cox ............ G11B 5/027 360/22 |
| 5,325,238 | A | * | 6/1994 | Stebbings ............ G11B 5/86 360/15 |
| 8,682,462 | B2 | | 3/2014 | Leonard |
| 9,264,835 | B2 | | 2/2016 | Condit et al. |
| 9,265,835 | B2 | | 2/2016 | Li et al. |
| 9,449,082 | B2 | | 9/2016 | Leonard |
| 2006/0152398 | A1 | | 7/2006 | Jubien et al. |
| 2016/0336911 | A1 | | 11/2016 | Leonard |
| 2017/0269898 | A1 | | 9/2017 | Barrett |

OTHER PUBLICATIONS

Saunders Jr, Joseph, "Nonfinal OA", U.S. Appl. No. 15/257,642, filed Sep. 6, 2016; dated Dec. 29, 2017.
Saunders, Jr., Joseph, "Final Office Action", U.S. Appl. No. 15/257,642, filed Sep. 6, 2016; dated May 10, 2018.

\* cited by examiner

SYSTEMS AND METHODS FOR DYNAMIC AUDIO PROCESSING

CROSS REFERENCE TO PRIOR APPLICATIONS

This application is a continuation of, and therefore claims priority under 35 USC § 120 to, U.S. application Ser. No. 14/224,009, filed Mar. 24, 2015, which is a continuation of, and therefore claims priority under 35 USC § 120 to, U.S. application Ser. No. 13/209,368, filed Aug. 13, 2011, now U.S. Pat. No. 8,682,462, each of which is incorporated by reference for all purposes.

BACKGROUND

Technical Field

The embodiments relate generally to systems and methods for processing audio, and, more specifically, to systems and methods for processing audio for increased perceived loudness while retaining changes in perceived volume.

Background Art

Audio production can include the pre-recording processing, recording, mixing, and/or mastering of sound. These phases of audio production can all involve processing of audio, which includes the manipulation of the audio to produce an improved digital audio file.

During audio processing, a representation of audio can be manipulated (e.g., enhanced) as either a digital or analog signal. A digital signal (i.e., digital audio) comprises a series of ones and zeros that represent a sound wave (i.e., audio). An analog signal (i.e., analog audio) comprises a continuous electrical signal that represents the sound wave. Digital manipulation (i.e., modulation) involves processing the ones and zeros of the digital signal, such as via a processor executing a formula. Analog manipulation (i.e., modulation) involves passing the analog signal through one or more physical components, such a circuit containing resistors, capacitors, op amps, and/or a vacuum tube. Whereas an analog compressor is made up of physical components, a digital compressor can be a set of instructions executed by a processor, such as a plug-in that operates within a digital audio workstation (DAW).

Typically, the audio that needs processing is one or more digital audio files. For example, a user may select one or more .WAV files representing songs that need processing. While the audio processing may take place entirely in the digital domain, the digital audio is commonly converted to analog audio and manipulated with analog audio components in most commercial audio production environments. This is the case, in part, because of the pleasing audio qualities that analog components can add to the audio. However, in environments where cost is a factor, some or all of the audio production process may be carried out digitally through the use of plugins and software, some of which may attempt to model the characteristics of physical analog equipment.

For example, the recording process involves recording sound in the digital domain in the form of digital audio files. Often, some processing, such as pre-mixing, of these files will occur in order to add some clarity or change the levels of the recorded audio, and to determine whether additional takes are necessary.

Similarly, the mixing process can involve processing audio by raising or lowering levels for particular tracks, adding effects, adding equalization, adding compression, and so forth, in order to create a clearer sounding audio production.

As another example, the mastering process involves enhancing recorded audio from a source, such as a compact disc (CD) containing a final mix of the recorded audio, to create a master version of the audio with improved sound translation and increased loudness for the best possible playback on various sound systems. The enhancement almost always includes modifying the audio by applying some form of compression, limiting, and/or equalization to the audio.

The end goal of the mastering process is typically to create a master version of the enhanced audio that can be used to replicate and/or distribute the audio. For example, the master audio may be stored digitally on a compact disk. Alternatively, an analog version of the master audio may be stored on tape or vinyl. In either case, the medium holding the final audio is referred to as the "master," and is generally used to replicate the audio, such as in the creation of vinyl, compact discs, digital files for download, or other music media for public use.

Mastering and mixing engineers and/or home users almost always need to apply corrective equalization and/or dynamics processing (e.g., compression and/or limiting) in order to improve upon sound translation on all playback systems and increase loudness. When processing audio, dynamics processing (e.g., dynamic compression or limiting) is used to increase the volume of the recorded audio to two or three times the original volume so that the volume level can be competitive with that of other music in the market for sale. Achieving competitive volume levels is important so that the mastered song is not perceived as quieter and/or less energetic than other songs played on a listener's sound system. However, this type of dynamic enhancement usually flattens the volume levels and dynamic changes in the audio, removing fluctuation in dynamics (loud parts vs. quiet parts) so that the listener is less able to distinguish volume changes in the music and the impact of dynamic instruments like drums. This type of compression and limiting is very common and the increases in levels can also cause audible distortion in the music.

Similar techniques are used, for example, to ensure that commercials are loud enough to stand out and catch the attention of viewers. Additionally, mixing engineers for television and movies process sounds, voices, music, etc. in order to achieve levels and clarity that is appropriate for the particular application.

In addition to audio professionals (e.g., mastering engineers, mixers, mixers for film (television and movie audio), audio engineers, audio producers, recording studio engineers, studio musicians, etc.), home enthusiasts and hobbyists may also be involved with various aspects of audio production. For example, some people record, mix, remix, master, and/or otherwise produce audio, such as music, as a hobby. Other people are stereo enthusiasts (e.g., audiophiles) who use hardware and/or software to process "finished" audio to achieve a better listening experience. Production of audio at nearly any level involves some form of audio processing. However, these hobbyists and at-home enthusiasts are often limited by their lack of training and the expense required to purchase professional-level equipment for achieving commercial-level loudness without destroying dynamics and/or introducing distortion.

Therefore, a need exists for systems and methods of processing audio that can achieve commercially competitive audio levels without destroying the dynamics (i.e., perceived volume changes) of the song or causing distortion in the audio.

Accordingly, systems and methods are provided herein for processing audio to bring the volume levels up to today's very loud digital levels (or louder) while reducing distortion and retaining more volume dynamics (i.e., perceived changes in volume) than prior systems have ever allowed in the past.

BRIEF DESCRIPTION OF THE DRAWINGS

The accompanying drawings, which are incorporated in and constitute a part of this disclosure, illustrate various embodiments and aspects of the present invention. In the drawings.

DETAILED DESCRIPTION OF THE DRAWINGS

Figure 1A:
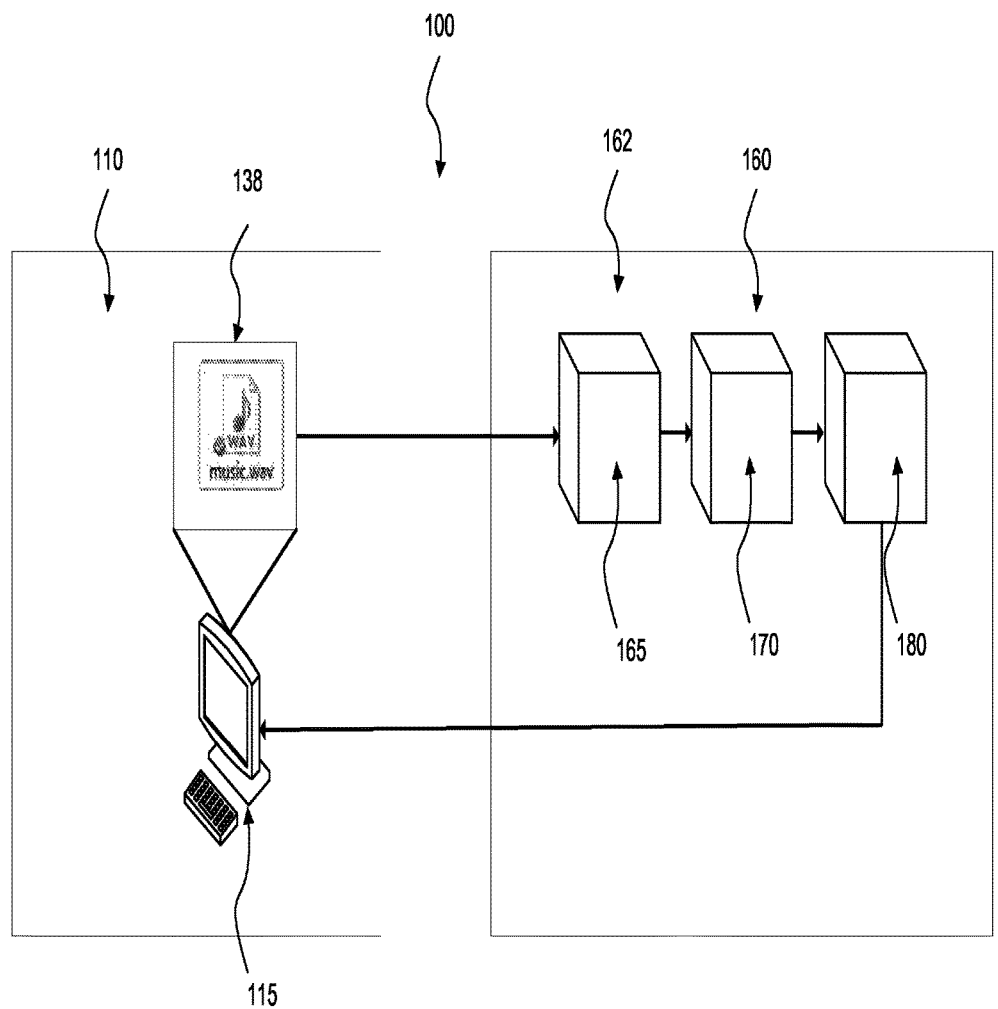
FIG. 1A is an exemplary illustration of a system for processing audio, in accordance with an embodiment.

Embodiments described herein include systems and methods for processing audio. In one embodiment the, system comprises a processor that plays a digital audio file. The digital audio file may contain metadata specifying a first clock frequency for normal playback. However, the processor plays the digital audio file at a second clock frequency that is higher than the first (i.e., normal) clock frequency, resulting in faster than normal playback.

In one embodiment, a digital-to-analog converter converts the digital audio into an analog signal (representing analog audio) while the digital audio is playing at the higher second clock frequency (i.e., faster than normal). This may raise the low frequency information to become higher frequency information of the digital audio file during playback, as compared to playback at the first clock frequency. The system may then pass the converted analog signal through an analog circuit to manipulate at least one sound characteristic of the analog audio. For example, the analog circuit may contain components for compressing, limiting, and/or making equalization adjustments to the analog audio.

Upon passing through the analog circuit, the system may route the manipulated analog signal to an analog-to-digital converter. The analog-to-digital converter may then convert the manipulated analog signal into a manipulated digital audio file, which is stored on a computer-readable storage medium. The processor then changes the clock frequency associated with the modified digital audio file back to the first (i.e., original and normal) clock frequency, for normal playback. This can lower the frequency range of the modified digital audio file to frequencies representative of the original digital audio file (aside from adjustments made using, for example, equalization during processing).

In one embodiment, the audio processing is carried out across multiple workstations and/or processors. For example, a first workstation may output the digital audio file to an analog circuit, which in turn outputs to a second workstation that converts the analog audio into a modified digital audio file. This may be thought of as a "throw and catch" arrangement.

In another embodiment, the system includes a monitoring circuit that converts a segment of the modified analog audio into a preview segment of digital audio that is played back for monitoring at the first clock frequency prior to the creation of the entire modified digital audio file.

In another embodiment, the manipulation of the digital audio file occurs entirely within the digital domain.

It is to be understood that both the foregoing general description and the following detailed description are exemplary and explanatory only and are not restrictive of the embodiments, as claimed.

Reference will now be made in detail to the present exemplary embodiments, including examples illustrated in the accompanying drawings. Wherever possible, the same reference numbers will be used throughout the drawings to refer to the same or like parts.

Exemplary embodiments herein allow a user to create audio files that can be perceived as louder, more dynamic, and/or less distorted than audio files created using traditional methods. In one embodiment, a digital audio file is assigned a clock frequency (i.e., second clock frequency) that is higher than the normal playback frequency (i.e., first clock frequency). Then the digital audio file may be played at the higher clock frequency (resulting in a faster playing speed and higher frequency information in the audio). In one embodiment, the digital audio file playing at the second frequency may then be converted to an analog signal and processed using one or more analog equalizers and/or analog dynamics processors (e.g., compressor, limiter, etc.) (i.e., an analog circuit). The analog audio signal (playing at the faster speed) may then be converted to digital by an analog-to-digital converter. In the digital domain, further processing can be applied in one embodiment. The resulting modified digital audio file may be saved to a non-transitory computer-readable medium, where the clock frequency of the resulting digital audio file is reset to the original normal playback frequency so that the modified digital audio file can be played at its original speed.

By processing the digital audio file while it plays at the higher frequency, less low frequencies are present in the digital audio file (and more high frequency information is present), and distortion attributable to passing low frequencies through digital-to-analog converters, compressors, limiters, equalizers, and/or other components may be reduced. This results in increased capability to make the audio louder, which in turn can result in a louder, clearer, and more dynamic audio file. Additionally, the faster playback speed can allow for faster audio processing when the entire analog audio signal must be converted back into and stored as a modified digital audio file.

Consequently, an embodiment herein may help users (e.g., mastering engineers, television or film mixers (mixing for film), home stereo enthusiasts (audiophiles), and/or anyone else who processes audio) create audio files with a competitive volume without distortion or diminished dynamics. For example, an embodiment also may help recording studios create listening versions of clients' recordings at a competitive volume so that the recording may be much louder but not distorted. As another example, a further embodiment may allow 'at home' studio engineers to create competitive and quality sounding recordings without spending money on a mastering engineer. Because an embodiment may allow for processing audio to contain higher volume levels with minimal difficulty, this may allow hobbyists and at-home enthusiasts a means of creating commercially-acceptable productions with reduced costs and/or training.

The methods disclosed herein may be executed in full or in part, for example, by a processor that executes instructions stored on a non-transitory computer-readable storage medium. Similarly, a system described herein may include a processor and a memory, the memory being a non-transitory computer-readable storage medium. As used herein, a non-transitory computer-readable storage medium refers to any type of physical memory on which information or data readable by a processor may be stored. Examples include random access memory (RAM), read-only memory (ROM), volatile memory, nonvolatile memory, hard drives, solid state drives, CD ROMs, DVDs, flash drives, disks, and any other known physical storage medium.

Additionally, singular terms, such as "processor," "memory," and "computer-readable storage medium," may additionally refer to multiple structures, such as a plurality of processors, memories, and/or computer-readable storage mediums. The same applies to the term computer, which is understood to contain at least one processor that is communicatively coupled to at least one memory.

As referred to herein, a "memory" may comprise any type of computer-readable storage medium unless otherwise specified. A computer-readable storage medium may store instructions for execution by a processor, including instructions for causing the processor to perform steps or stages consistent with an embodiment herein. Additionally, one or more computer-readable storage mediums may be utilized in implementing a computer-implemented method. The term "computer-readable storage medium" should be understood to exclude carrier waves and transitory signals.

Additionally, although "mastering" may be used as an example throughout, it is understood that the following description applies to other forms of audio production and/or audio processing, such as mixing, recording, pre-recording, and other forms of post-production.

FIG. 1A is an exemplary illustration of a system 100 for processing audio, in accordance with an embodiment. In this example, the components of the system are split into the digital domain 110 and analog domain 160.

In particular, the system 100 may include a computer (e.g., workstation) 115 that stores a digital audio file 138. The computer may comprise one or more computers (e.g., workstations). A workstation (e.g., digital audio workstation (DAW)) can comprise at least one processor and a computer readable storage medium. In one embodiment, the workstation is a stand-alone device built specifically for handling audio production, mixing, and/or processing. For example, the workstation may have an integrated mixer, audio sequencer, and/or effects capabilities. In another embodiment, the workstation can comprise a personal computer with software being executed by a processor for the purpose of audio production, recording, mixing, and/or mastering.

In one embodiment, the digital audio file 138 is stored when the computer 115 records the digital audio file (e.g., in a recording environment). In another embodiment, the computer 115 may simply import and store a previously-recorded digital audio file 138. For example, at a mastering studio, a client may bring a CD containing the digital audio file 138, which is then accessed by computer 115. Alternatively, the client may provide a link for downloading the digital audio file 138 onto computer 115, such as by sharing a cloud-computing folder containing the digital audio file 138.

The digital audio file 138, as discussed herein, may include any file format that contains a representation of audio, such as .WAV, .AIFF, .MP3, SDII, AC3, DSD, or any number of audio file formats. For example, the digital audio file 138 shown in FIG. 1A is a .WAV file, which is compatible with the Windows™ operating system and typically contains non-compressed audio information (i.e., a relatively large file that contains all recorded audio information). However, other file types are possible. For example, the digital audio file 138 can even include a video file type, such as .AVI, to the extent that the video file type includes an audio track or portion.

The digital audio file 138 may also contain metadata that specifies characteristics of the digital audio file 138, such as the bit rate and the sample rate. Other characteristics can also be identified in the metadata. For example, .WAV files contain a header that can indicate surround sound and speaker positions, provide information regarding sample types, and supports defining custom extensions to the format chunk.

The sample rate may indicate the number of samples per second used in a digital representation of an analog signal. The bit rate may indicate the number of bits used to represent the level of the sample. In theory, the higher the sample rate and bit rate, the closer a discrete digital audio file represents the continuous analog audio signal that it emulates.

The normal playback or recording frequency (sample rate) can vary between different digital audio files. The playback frequency is the sample rate indicated by the metadata, in an embodiment. For example, the standard sample rate (i.e., normal playback frequency) used for digital audio files on audio compact discs (e.g., music CDs) is 44,100 samples per second (44.1 kHz), with 16 bits of information per sample. Digital Video Discs (DVDs), on the other hand, contain digital audio files with a sample rate of 48 kHz and 24 bits of information per sample.

For example, to playback a digital audio file recorded at 44.1 kHz, the playback device will either read the metadata and automatically switch to a 44.1 kHz sample rate, or the user may have to select what sample rate the audio was recorded at, depending on the embodiment. If the wrong sample rate is selected the audio may playback at an incorrect speed. Some systems may automatically sample rate convert the digital audio if the correct sample rate is not selected in the system. This will resample the audio file so that it plays at the correct speed (maintaining the frequencies of the originally-recorded audio). Sample rate conversions generally can lead to fidelity loss and are avoided by audio professionals if possible.

Additionally, music files can be recorded at a variety of different sample rates (resulting in a variety of different normal playback frequencies). For example, some professional audio hardware provides the option for sample rates of 88.2 kHz, 96 kHz, and/or 192 kHz. Even though standard audio applications tend to call for digital audio files with 44.1 kHz or 48 kHz sample rates, higher sample rates can be useful in audio recording applications where effects are applied to ensure that the modified source information is as close to the original analog signal (e.g., the signal generated by pressure on a microphone diaphragm) as possible.

In the case of audio with a non-commercial sample rate, the sample rate can be converted to a standard sample rate (e.g., 44.1 kHz or 48 kHz) at a later time, such as when creating mixes or master versions of the audio. Converting the sample rate involves re-approximating the represented audio signal at the new sample rate, in order to preserve the frequencies and overall sound of the digital audio file. This is a different concept than changing the playback frequency of a digital audio file, which causes the digital audio file to play back faster or slower at higher or lower frequencies, respectively. Converting the sample rate instead maintains the frequency response of the audio.

In one embodiment, the digital audio file 138 may have metadata indicating a first clock frequency to use for normal playback. For example, the metadata may indicate a sample rate of 44.1 kHz. In one embodiment, the sample rate may also be the clock frequency.

In another embodiment, the sample rate can be extrapolated into a clock frequency to use for normal playback. For example, because each sample of the digital audio file contains multiple bits-worth of information, if the system ties the clock to a particular amount of data to be processed, the actual clock frequency for playback may also depend on the bit rate, which also may be indicated by metadata in the digital audio file 138. However, the sample rate indicated by metadata in many systems indicates the actual clock frequency for normal playback, eliminating the need for the processor to calculate a different clock frequency for use in playback. However, either embodiment is considered to indicate a first clock frequency for a processor to use for normal playback.

In one embodiment, the digital audio file is converted to an analog signal. The processor (e.g., of the digital audio workstation 115) facilitates playback by routing information from the digital audio file 138 at a specified playback clock frequency (e.g., sample rate). In one embodiment, the information is routed to a digital-to-analog converter by the processor. The digital-to-analog converter converts the digital signal into an analog signal (used in analog domain 160), which is ultimately supplied to speakers to produce pressure differences in the air that are perceived as sound.

In another embodiment, the processor routes the information to a digital processor module (e.g., plugin) that emulates analog hardware. This can allow for additional digital effects to be applied to the digital audio file 138 in the digital domain 110 in a way consistent with how effects are applied in real time in an analog domain 160. However, the digital audio is not audible to a listener without first being converted into an analog signal.

In one embodiment, the processor is included in computer 115 (which can include one or more computers). In another embodiment, the processor is located outside computer 115, such as in an interface or module that is communicatively coupled to computer 115.

The processor may cause the audio file 138 to play at a second clock frequency that is higher than the first clock frequency. For example, the processor may set the metadata of the digital audio file to indicate a second clock frequency for playback that is double the first clock frequency. However, other combinations are possible, such as a 25 percent higher clock frequency.

Using the second (i.e., higher) clock frequency for playback causes the digital audio file 138 to playback at a faster speed than normal. As a result, the digital file exhibits higher frequency characteristics than when played at the normal playback frequency, and also completes playback sooner. For example, by doubling the clock frequency, a digital audio file with audio information up to 22,500 Hz can have audio information up to 44,100 KHz, which is far outside the range of human hearing.

In one embodiment, the clock frequency is chosen to substantially reduce or virtually eliminate audio frequency information below 250 Hz. This low frequency information often creates a "muddy" sound and may be the cause of distortion created by digital-to-analog converters and/or analog components, such as a compressor, or digital components, such as digital audio processors. The exact clock frequency needed to raise the low frequency information above this threshold may vary depending on the source audio information. For example, if an audio file has substantial audio information at 200 Hz, a 25 percent increase in clock frequency will move that audio information to above 250 Hz. In one embodiment, the ideal clock frequency is chosen automatically by the processor, which analyzes the digital audio file to determine which clock frequency will move audible levels of audio information to above 100 Hz.

In one embodiment, a digital-to-analog converter may convert the digital audio into an analog audio signal while the digital audio is playing at the higher second clock frequency. Because the processor plays the digital audio file 138 at the higher second clock frequency, less low frequency information is passed through the converters (relative to when the digital audio file 138 is played at a higher frequency), which may reduce distortion and allow for a louder analog audio signal. Eliminating and/or reducing low frequency information lightens the load on these components (including the analog input of analog-to-digital converters, in which low-frequency information can account for significant portions of current, causing overloading and/or distortion), which can result in a clearer analog audio signal.

The audio signal, as a result, may require less compression since it is already louder. This, in turn, may also allow for maintaining dynamics in volume while still achieving commercial loudness levels. This may further lead to more clarity in the digital-to-analog conversion, since lower frequencies are often the cause of the most audible distortion during the conversion process.

The digital-to-analog converters may reside on computer 115 in one embodiment, for example, as part of a sound card. In another embodiment, the converter(s) may be located externally to computer 115.

The clock signal used to play the digital audio 138 at the higher second clock frequency may be generated by computer 115 (e.g., by the processor) in one embodiment. Alternatively, a module communicatively coupled to the computer 115 may be responsible for generating the clock signal in another embodiment. For example, a separate clock module may be used to reduce an effect called jitter by having the clock module supply the processor with a more accurate clock signal. Other modules, such as the digital-to-analog converter module, may alternatively supply the clock signal to the processor.

Although the sample rate is changed in metadata to reflect the second clock frequency in one embodiment, an alternate embodiment does not alter the metadata. Instead, the DAW 115 may notify an external converter of the playback clock frequency to use. Or the user may select the clock frequency on the device supplying the clock signal. The external converter may not check the metadata of the digital audio file, but instead will supply the clock at the frequency indicated by the DAW or user. In this embodiment, after the audio has been processed, the resulting modified digital audio file may already contain the correct metadata for sample rate. However, in one embodiment, the external converter must be notified to change the clock frequency back to the first frequency for normal playback.

In one embodiment, once the digital signal (created in the digital domain 110 during playback) is converted to an analog signal, an analog circuit 162 may apply at least one dynamic modification to the analog signal. The dynamic modifications (i.e., effects) applied may include at least one of compression, limiting, and equalization. In one embodiment, additional effects are possible, such as stereo field effects, exciter effects, tape emulation effects, etc. In order to apply these effects, the analog circuit 162 may comprise one or more hardware modules, such as modules 165, 170, and 180. The modules may comprise any known combination of circuitry and analog components for applying compression, limiting, and/or equalization, depending on the dynamic effect applied by the particular module.

Additionally, each of the modules may be connected to one another in an effects chain in one embodiment. In an effects chain, the output from one module can serve as an input for another module. For example, a compressor module 165 may output a modified analog signal that is received as an input at a limiter module 170. The output of limiter module 170 may then be received as an input of equalization module 180. In the example shown in FIG. 1A, the output of the equalization module 180 could be sent to an analog-to-digital converter so that the modified analog signal may be converted back into digital audio. Additionally, although the example in FIG. 1A illustrates a signal chain wherein compression is provided first, then limiting, and then equalization, effects may also be provided in other orders. For example, equalization may be applied before any compression in another embodiment.

In one embodiment, multiple modules of the analog circuit 162 may be part of a single hardware module (e.g., product) that is capable of applying multiple effect types.

Continuing with the example of FIG. 1A, the compressor module 165 is used to compress the dynamic range of the audio signal. This type of compression is distinct from data compression, in which the information is optimized for a smaller file size. In dynamic range compression, quiet sounds can be made louder by reducing the dynamic range of loudness and amplifying the quiet sounds.

The type of compression applied may vary between embodiments. For example, a peak sensing compressor may respond to an instantaneous level of the input signal. This type of compression may provide tighter peak control, but can yield very quick changes in gain reduction, which under traditional audio processing methods can lead to audible distortion. Alternatively, an averaging compressor may be used to apply an averaging function (such as root mean squared ("RMS")) on the input signal before its level is compared to the threshold. Some compressors may include controls or inputs to set a compression ratio, which typically determines the reduction of signal loudness, and a gain level to increase the loudness of the audio signal. Other controls, such as attack, release, and knee control may be provided to help shape the compression. The attack may determine the period when the compressor decreases gain to reach the level governed by the ratio. The release may determine the period when the compressor is increasing gain to the level governed by the ratio, or, to zero dB, once the level has fallen below the threshold. The length of each period may be determined by the rate of change and the required change in gain. In one embodiment, the attack and release times are adjustable by the user. In another embodiment, the attack and release times determined by the circuit design and cannot be adjusted by the user.

In an embodiment, providing an audio signal at a second (i.e., higher) clock frequency reduces the distortion caused by the compressor module 165. This is because less low frequencies may be presented to the compressor module 165 than if the signal had been created by playing the audio at the first clock frequency. Because lower frequencies can cause a bottle neck in compressors, restricting how much output can be attained before distortion occurs, providing a signal with less low frequency information can result in less distortion when applying compression. Continuing with FIG. 1A, a limiter module 170 may receive a modified analog signal from compressor module 165. Limiting, as provided by the limiter module 170, is technically another form of compression that includes a very high compression ratio. For example, a compression ratio between 60:1 and .infin.:1 may be used in limiting. The purpose of limiting is generally to keep the audio signal level below 0 dB, to avoid "clipping." Audio engineers and producers typically try to avoid clipping because clipping results in a harsh and typically undesirable audio artifact. In an alternate embodiment, limiting is not applied because the converters effectively limit the audio signal when the low-frequency information is no longer present.

With prior systems, if limiting is relied on too heavily to reduce audio levels, overload and distortion can occur. For example, when the signal processed by the limiter is consistently far above 0 dB, the amount of compression applied by the limiter can cause distortion for similar reasons as explained above with regard to compressors. But, in one aspect, because the analog signal is created at the higher second clock frequency, less low frequencies may be presented and outputted to and from the limiter module 170 than if the signal had been created by playing the audio at the first clock frequency. Providing a signal with less low frequencies, as accomplished in an embodiment herein, can result in less distortion during limiting.

As shown in FIG. 1A, an equalization module 180 may apply equalization to the audio signal. Equalization may alter the frequency response of the audio signal, amplifying some frequencies and/or reducing some frequencies. This can be used, for example, to emphasize different frequencies across the stereo field to make particular sounds, instruments, and/or voices stand out in an audio mix. However, analog equalization hardware, particularly cheap equalization hardware commonly found in home studios, can introduce distortion in the low frequencies if the audio signal is too loud for the equalizer to handle. Therefore, by using an audio signal generated according to a second (i.e., higher clock frequency), less low-end frequency information is effected by any such distortion.

In the example of FIG. 1A, once the modified analog signal is output from the last effects module (e.g., equalization module 180), the modified analog signal is converted back into a digital audio file through use of an analog-to-digital converter. This conversion occurs without changing the speed of the audio file. In other words, the converted file initially may be set to play at the second clock frequency.

In an alternate embodiment, the analog-to-digital converter may be set to change the playback clock frequency (e.g., sample rate) of the modified audio signal as compared to the original digital audio file without modifying the metadata. In this instance, the playback clock frequency supplied (e.g., using a crystal oscillator) by the analog-to-digital converter may be changed accordingly to cause the modified digital audio file to play at the same speed as the original digital audio file with the second (i.e., higher) playback frequency. In one such embodiment, the external converter may not know the contents of the metadata at any point in the process. In this way, no changes to the sample rate specified in metadata occur in one embodiment.

The resulting manipulated digital audio file is stored on a non-transitory computer-readable storage medium in one embodiment. This non-transitory computer-readable storage medium may be located on computer 115 in one embodiment, such as on a disk drive or some other storage medium. In another embodiment, the non-transitory computer-readable storage medium is located on a separate product or workstation from computer 115.

Once the manipulated digital audio file has been stored, in one aspect, the processor sets the metadata of the manipulated digital audio to indicate the first clock frequency for normal playback speed. This effectively restores the frequency response of the manipulated digital audio file heard when the manipulated digital audio file is played, eliminating any "chipmunk effect" caused by setting the playback frequency to the second (i.e., higher) frequency prior to dynamic enhancement.

The processor that sets the metadata of the manipulated digital audio can be one or more of the processors included in computer 115 in one embodiment. However, because the term "processor" can include a plurality of processors, including processors that are part of different devices and/or workstations, the processor that sets the metadata of the manipulated digital audio to indicate the first clock frequency for normal playback speed may be located somewhere besides computer 115, such as in a different workstation or device in one embodiment.

In an alternate embodiment, one or more of the analog modules 165, 170, and/or 180 are modeled in the digital domain 110. "Modeling" may include a series of algorithms or equations that emulate the effect of hardware used in the analog domain 160 to manipulate the analog signal. For example, each component of a compressor module 165 may be modeled such that a digital effect can be created that functions similarly to the analog counterpart. Rather than applying a particular dynamic enhancement in the analog domain 160, the modeled digital effect is instead applied in the digital domain 110. In this alternate embodiment, digital effects modules may be employed to emulate one or more analog modules 165, 170, 180. For example, the digital audio file 138 may still be played at the second (i.e., higher) frequency, during which time the digital effects are applied to the digital audio signal. Because the digital signal is supplied to the emulated analog circuit at the second (i.e., higher) clock frequency, results similar to those described with respect to the analog domain 160 may be possible.

Figure 1B:
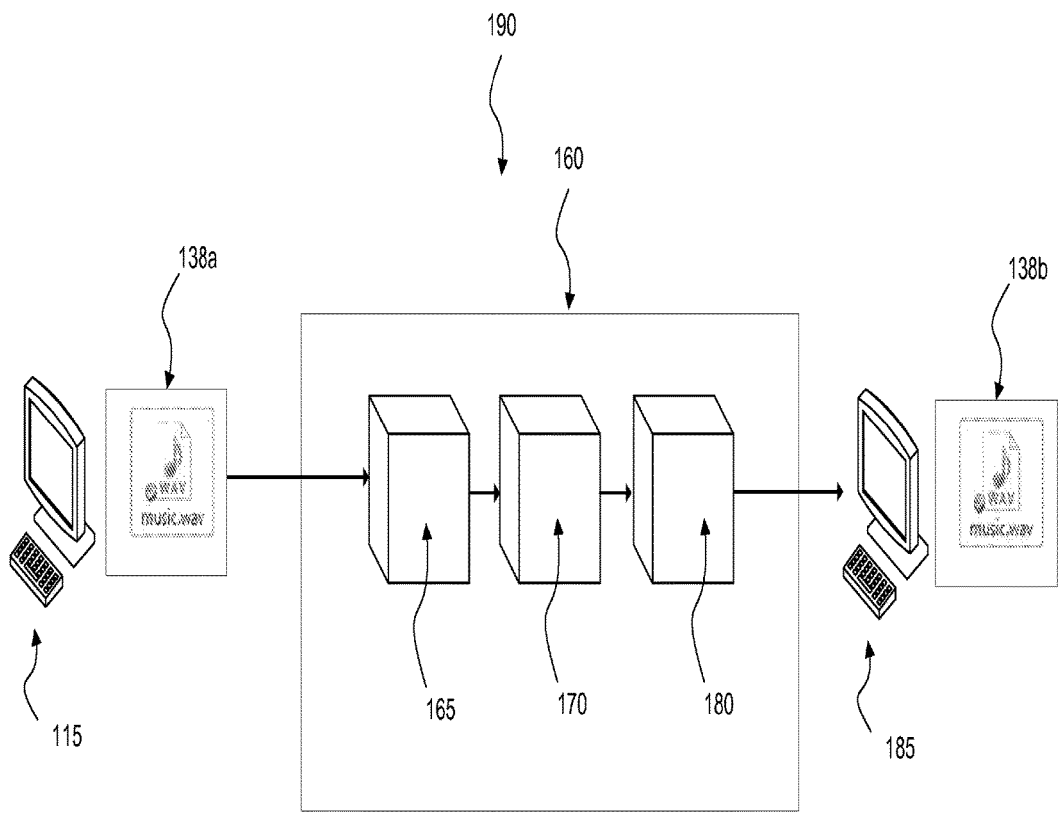
FIG. 1B is an exemplary illustration of an alternate system for processing audio, in accordance with an embodiment.

FIG. 1B is an exemplary illustration of an alternate system 190 for processing audio, in accordance with an embodiment. This alternate embodiment utilizes multiple workstations 115 and 185 to carry out the audio processing. Each workstation 115 and 185 can include its own processor(s). It is understood that reference to a processor herein can include both a first processor of the first workstation 115 and a second processor of the second workstation 185.

In the illustrated system 190, a first workstation 115 may convert the original digital audio file 138a into analog, and send the analog signal to the analog circuit 162 for processing. It is understood that this conversion can utilize an external converter in one embodiment.

Then, the modified (i.e., processed) audio is sent to the second workstation 185.

In one embodiment, this includes sending the modified analog signal to the second workstation 185, where it is converted into a modified digital audio file 138b. In this embodiment, the modified digital audio file 138b can be stored on the second workstation 185 or on some other computer-readable medium.

The other aspects the system 190 in FIG. 1B can behave similarly to embodiments described with respect to FIG. 1A.

Figure 2:
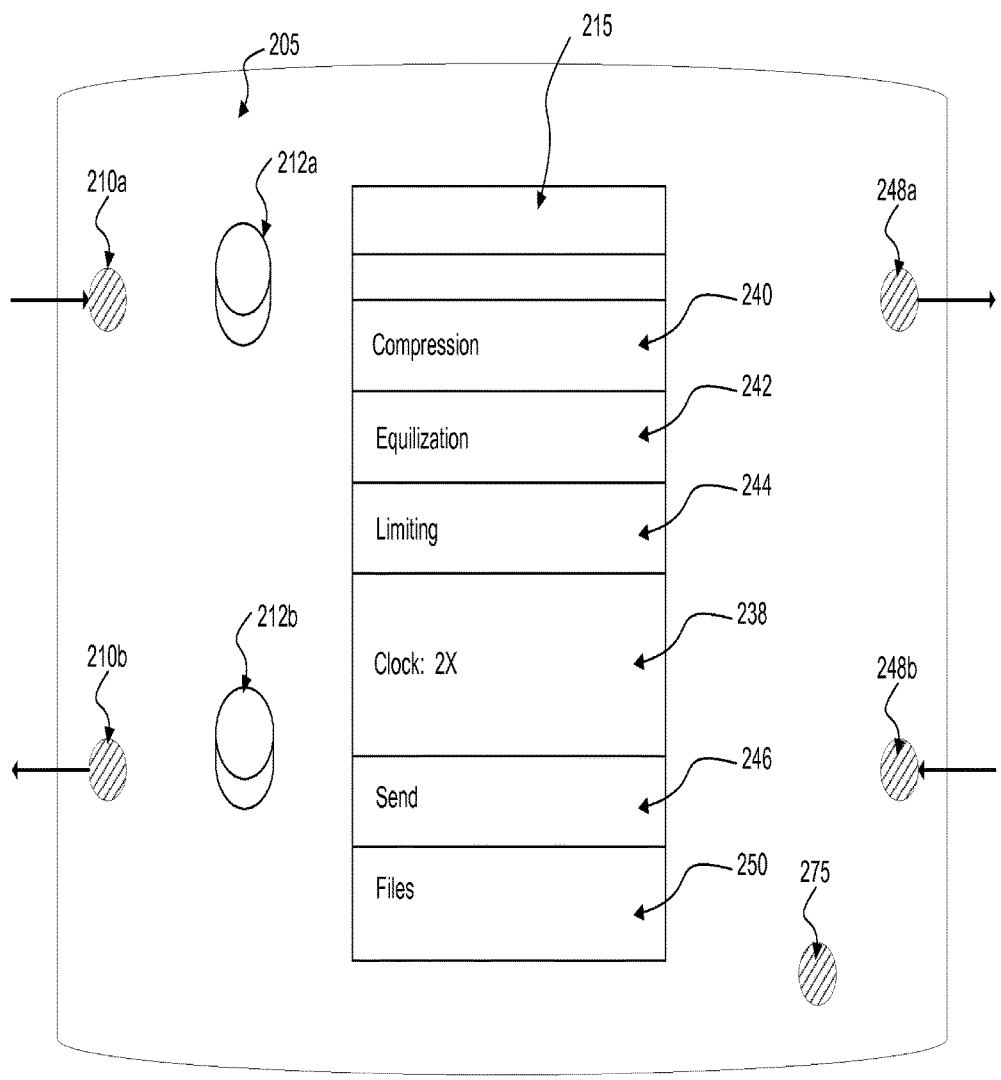
FIG. 2 is an exemplary illustration of an audio processing device, in accordance with an embodiment.

Turning to FIG. 2, an exemplary illustration of an audio processing device 205 is shown in accordance with an embodiment. Audio processing device 205 may be a standalone product in one embodiment, that connects to a DAW.

The audio processing device 205 may receive audio information through input 210a in one embodiment. This audio information may be a digital audio file. The digital audio file may be a portion of some larger digital audio file in one embodiment. For example, the audio processing device 205 may interface with an external digital audio workstation (DAW) in one embodiment, and receive a portion of a digital audio file from the DAW. In one embodiment, the DAW may be executing audio sequencing and/or editing software that allows a user to select a portion of a digital audio file for manipulation. Software executed on the DAW, such as a plugin, may facilitate communications between the DAW and the audio processing device 205 such that the workstation may export at least a portion of a digital audio file to the audio processing device 205. These communications may be received by the audio processing device 205 through digital input 210a. The protocol for communications can vary between embodiments. The DAW is able to automate the audio processing from within the DAW software environment in one embodiment, sending one or more commands to the audio processing device 205 to control various aspects of the mastering process.

In one embodiment, the audio processing device 205 also contains an output 210b for sending the manipulated digital audio file to a receiver device. The receiver device can be the DAW, or it can be some other device that includes a non-transient computer-readable storage medium. In one embodiment, the DAW causes the audio processing device 205 to export a manipulated digital audio file back to the DAW. Once the DAW receives the manipulated digital audio file, the DAW may automatically integrate the manipulated digital audio file into the DAW environment. For example, if the DAW is used in a movie production environment, an audio portion of a video file may be sent to the audio processing device 205, and the DAW may automatically replace the audio portion with the manipulated digital audio file received from the audio processing device.

In another embodiment, the manipulated digital audio file is stored on a computer-readable storage medium contained in the audio processing device 205, and is manually exported later, such as by connecting the audio processing device 205 to a DAW and browsing memory contents for the manipulated digital audio file. In this embodiment, the contents of the computer-readable storage medium contained in the audio processing device 205 may be browsed. In one embodiment, the contents are browsed from the DAW. In another embodiment, display 215 is capable of displaying files 250 currently stored on the audio processing device 205.

In one embodiment, a single cable connects the audio processing device 205 to the DAW, through a single connection that encompasses both input 210a and output 210b. This connection may be a transceiver. The embodiments discussed herein are not limited to a specific transfer protocol. For example, USB, Firewire, Ethernet, HDMI, SATA, and SAS are just some of the protocols that may be implemented in various embodiments to facilitate communication and file transfers between the audio processing device 205 and a DAW.

In one embodiment, a first level control 212a is provided to control the volume level of the audio. In one embodiment the level control 212a controls the level of the analog audio signal before it is routed through the analog circuit. In another embodiment, the level control 212a controls the level of the received digital audio file. This may allow a user to raise or lower the volume of the analog or digital audio file before it is manipulated by audio processing. Similarly, in another embodiment, an output level control 212b is provided for adjusting the volume of the manipulated analog audio before it is sent to an analog-to-digital converter. In another embodiment, the output level control 212b controls the level of a manipulated digital audio file (i.e., after audio processing), before the manipulated audio file is sent back to the DAW.

In one embodiment, the audio processing device 205 may contain digital-to-analog converters for converting the digital audio file into an analog signal before audio processing. Similarly, the audio processing device 205 may contain analog-to-digital converters for converting the manipulated audio back into a manipulated digital audio file. In addition or alternatively, the audio processing device 205 may control the DAW to cause the digital-to-analog conversion and analog-to-digital conversion to occur using the converters used by the DAW. For example, if the DAW is already equipped with and/or communicatively coupled to high-end converters, it may be advantageous to use those DAW converters instead of converters that may be built into the audio processing device 205. In still another embodiment, the audio processing device 205 is equipped with an interface for connecting to external converter modules. This may allow the audio processing device 205 to utilize stand-alone converters for the conversion process. The interface can use any protocol known in the art for communicating with D/A and A/D converters.

In the example of FIG. 2, the audio processing device 205 contains a display 215 for assisting the user in applying various dynamic adjustments to the audio. The display 215 can be a liquid crystal display in one embodiment. In another embodiment, the display 215 can be a touch screen display. In one embodiment, the display helps the user control the analog circuit for applying compression 240, equalization 242, and/or limiting 244.

Additionally, in one embodiment, the audio processing device 205 also allows the user to specify the second clock frequency that is used for playing the digital audio file at a faster speed during conversion into an analog audio signal. In one embodiment, the second clock frequency may be selected based on a multiple of the original (i.e., normal) playback clock frequency. For example, as shown in FIG. 2, the user may select to double the playback clock frequency, which results in doubling the frequency response characteristics of the digital audio file, and causes playback to occur at two times the normal playback speed. In this embodiment, the audio processing device 205 may automatically detect the first (i.e., normal) clock frequency of the digital audio file. This can be done, for example, by recognizing the file type, determining the clock frequency metadata that corresponds to that file type, and then retrieving the first clock frequency from the metadata. For example, if the first clock frequency is 44.1 kHz, the second clock frequency in the example of FIG. 2 could be 88.2 kHz. In another embodiment, the user may enter a specific clock frequency to use as the second clock frequency.

The audio processing device 205 may automatically store the first (i.e., normal) clock frequency of the digital audio file, so that the manipulated digital audio file can be restored to the first clock frequency after the manipulated digital audio file is created. In this embodiment, once the manipulated digital audio file is created (e.g., after manipulation by the analog circuit and conversion by the analog-to-digital converter), the audio processing device 205 may set the clock frequency value in the metadata of the manipulated digital audio file to indicate the first clock frequency. Thus, when the manipulated digital audio file is played back on the DAW (or, in one embodiment, on the audio processing device), the playback will sound normal and not have the added "chipmunk" effect.

Additionally, in one embodiment, the audio processing device 205 may send 246 the analog audio signal to external analog devices. For example, output 248a may be used to couple the audio processing device 205 with an external analog device. The analog audio signal can then be sent, for example, to a compressor, limiter, and/or equalization module that resides external to the audio processing device 205. A return 248b may be provided for returning the manipulated analog signal back to the audio processing device 205.

In still another embodiment, the audio processing device 205 may contain a monitoring output for listening to the audio during the mastering process. In general, this allows a user to hear the effects of the mastering and make adjustments to the various modules (i.e., components) of the analog circuit. In one embodiment, the user may listen to the sped-up audio during manipulated by the analog circuit.

In another embodiment, a "time warp" monitoring feature is used for monitoring the analog audio at the normal playback frequency. This may allow a user to listen to the audio without the "chipmunk" effect, and hear how the audio will sound once the playback clock frequency is reset to the first frequency. In one embodiment, the audio processing device 205 may utilize a second pair of analog-to-digital converters to create short digital audio files (i.e., monitoring files) that represent segments of the analog audio signal being manipulated. The processor may then set the playback frequency of the short digital audio files to the first clock frequency, effectively slowing the playback speed to normal. The short digital audio files may then be played in succession by converting them back into an analog signal that is sent to monitors (e.g., speakers and/or headphones).

These short audio files may range in length in various embodiments. In one embodiment, the short digital audio files are 5 seconds long. The audio processing device 205 may create these short monitoring files, for example, by converting an even shorter segment of analog audio to a digital audio file, setting the playback frequency to the slower first frequency. Although this technique necessarily will cause monitoring to lag a few seconds behind any dynamics modifications applied by the user, it may still allow the user to listen to segments of audio without the chipmunk effect, so that the user does not need to complete the mastering process before hearing the results of the dynamics modifications at the normal playback frequency.

Additionally, in one embodiment with the "time warp" monitoring feature, the user can select the length of the monitoring segments. While longer lengths may allow a more natural listening experience (i.e., less chopped up audio segments), more time will lapse between when the user makes a dynamic adjustment (i.e., compression, limiting, and/or equalization) and when the user can actually hear the result of the adjustment at the first playback frequency.

The analog audio segments that are converted for monitoring purposes may not be continuous. This is because audio files play slower at the first clock frequency than at the second clock frequency. Therefore, to ensure that the monitoring does not lag too far behind the dynamics adjustments made by the user, the time interval (e.g., 5 second) specified by the user may be used to "catch up" the monitored files, such that at the beginning of each time interval a new monitoring segment begins near real time. With this method, monitoring segments of shorter lengths, such as 1 second, may allow for monitoring near real time, but with choppy playback since each segment begins near real time based on the manipulated audio signal, which is playing at a faster speed based on being created with the second clock frequency.

In one embodiment, the user may manually select whether the monitoring output is real time monitoring of the sped up playback, or time warped monitoring of the manipulated audio signal.

Figure 3A:
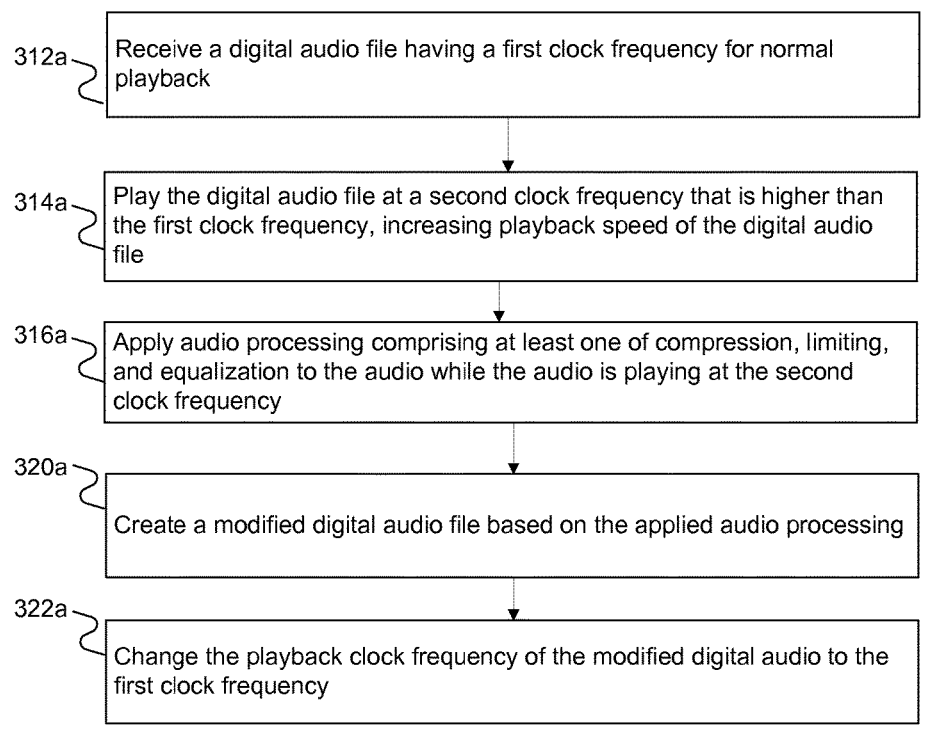
FIGS. 3A-B are exemplary flow charts with non-exhaustive listings of steps that may be performed in an audio processing environment, in accordance with an embodiment.
Figure 3B:
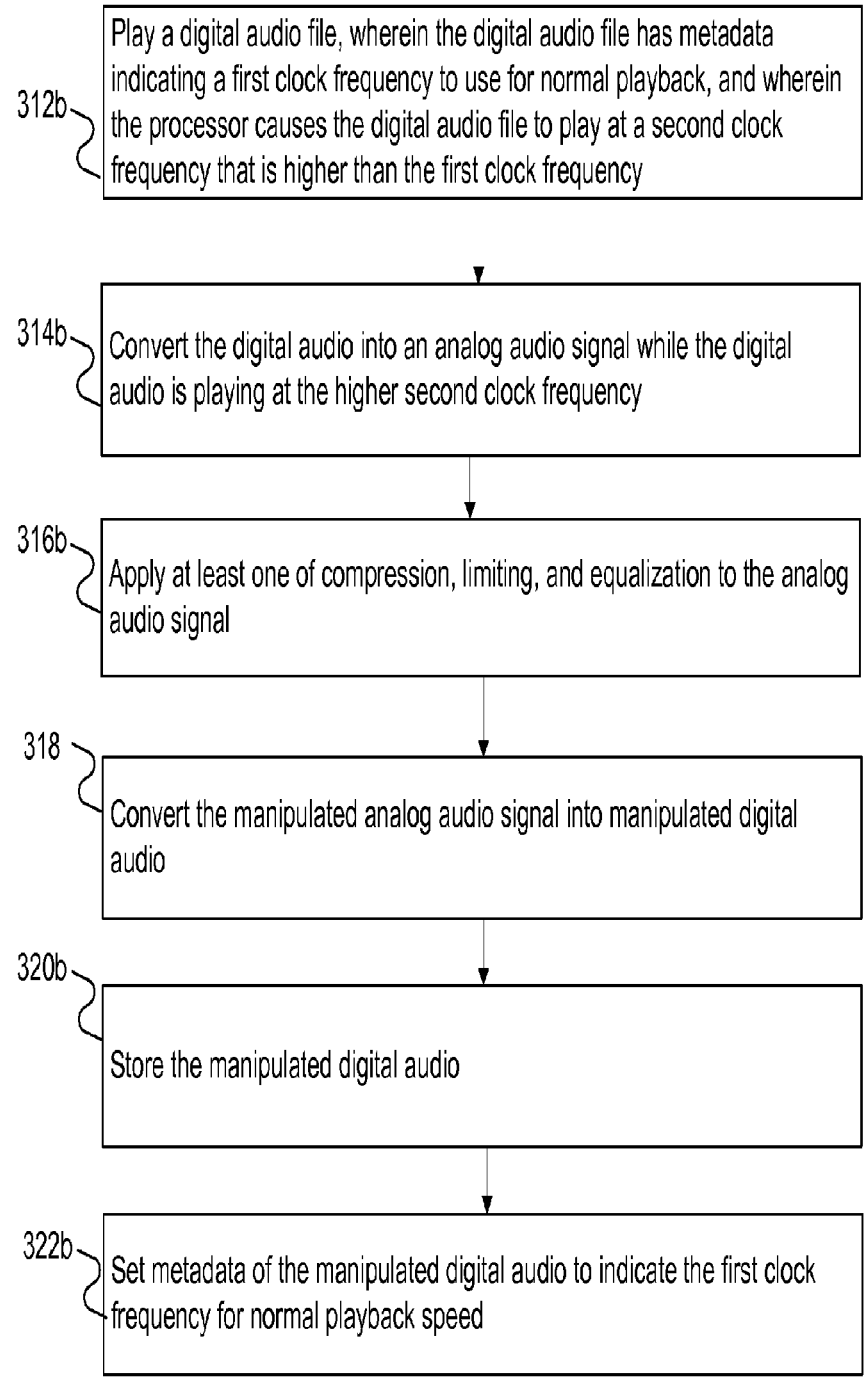

FIGS. 3A-B are exemplary flow charts with non-exhaustive listings of steps that may be performed in accordance with an embodiment. At step 312a of FIG. 3A, a DAW (e.g., computer, audio processing device, etc.) receives a digital audio file having a first clock frequency for normal playback. The digital audio file may be received by importing the file in one embodiment. The digital audio file may also be received by recording audio onto a computer-readable medium.

As step 312a of FIG. 3A indicates, the digital audio file has a first clock frequency associated with it for normal playback. Similarly, in step 312b of FIG. 3B, a processor plays a digital audio file, wherein the digital audio file has metadata indicating a first clock frequency to use for normal playback. Because digital audio files can be created using various different sample rates, the first frequency for normal playback may correlate to the sample and bit rate of the particular digital audio file. Normal playback includes playing the audio file back without changing the pitch or the speed of the digital audio file.

At step 312b, the processor causes the digital audio file to play at a second clock frequency that is higher than the first clock frequency. Similarly, at step 314a, the digital audio file is played at a second clock frequency that is higher than the first clock frequency, increasing playback speed of the digital audio file.

In one embodiment, the steps of FIG. 3A are performed purely in the digital domain. For example, although step 314a may include converting the digital audio file into an analog signal, in one embodiment the digital audio file is played purely in the digital domain. In step 314a, playback does not necessarily require the digital audio to be audible to a listener. In a purely digital context, the digital audio file may be played by processing it as if it were being converted into analog but without using a physical digital-to-analog converter. Instead, the processor may route the audio information to a plugin, which utilizes the second clock frequency. A processor may read the digital audio file at the second playback frequency, and apply formulas (representing analog models) to the resulting time-based array of bits to apply compression, limiting, and/or equalization. Because accurate digital models of the analog components may behave similarly to the corresponding analog components, processing the digital audio file at the second clock frequency as described herein may provide similar benefits to those already outlined with regard to processing the analog signal with the analog circuit.

The other steps of FIG. 3A may also be carried out in the digital domain in one embodiment. As discussed above, at step 316, the processor may apply audio processing (e.g., via plugin) comprising at least one of compression, limiting, and equalization to the audio while utilizing (e.g., internally playing the audio file at) the second clock frequency.

Then, at step 320a, the processor may create a modified digital audio file based on the applied audio processing. This may include saving the manipulated digital audio file, which has modified contents, over the source (i.e., original) digital audio file. In another embodiment, the manipulated digital audio file is saved separately from the original digital audio file.

Finally, at step 322a, the processor may change the playback clock frequency of the modified digital audio to the first clock frequency, ensuring proper playback of the manipulated digital audio file.

Unlike FIG. 3A, the steps of FIG. 3B necessarily require converting the digital audio file for processing within the analog domain. In particular, step 314b includes converting the digital audio into an analog audio signal while the digital audio is playing at the higher second clock frequency.

Then, step 316b includes applying at least one of compression, limiting, and equalization to the analog audio signal. This can include, for example, passing the analog audio signal through a circuit containing analog hardware that modifies characteristics of the audio signal.

At step 318, the an analog-to-digital converter may convert the manipulated analog audio signal into manipulated digital audio. Then, at step 320b, the processor stores the manipulated digital audio on a computer-readable storage medium. This computer readable storage medium may be located on a separate workstation than the workstation that played the digital audio file in one embodiment.

Finally, at step 322b, the processor may set metadata of the manipulated digital audio to indicate the first clock frequency for normal playback speed.

Figure 4:
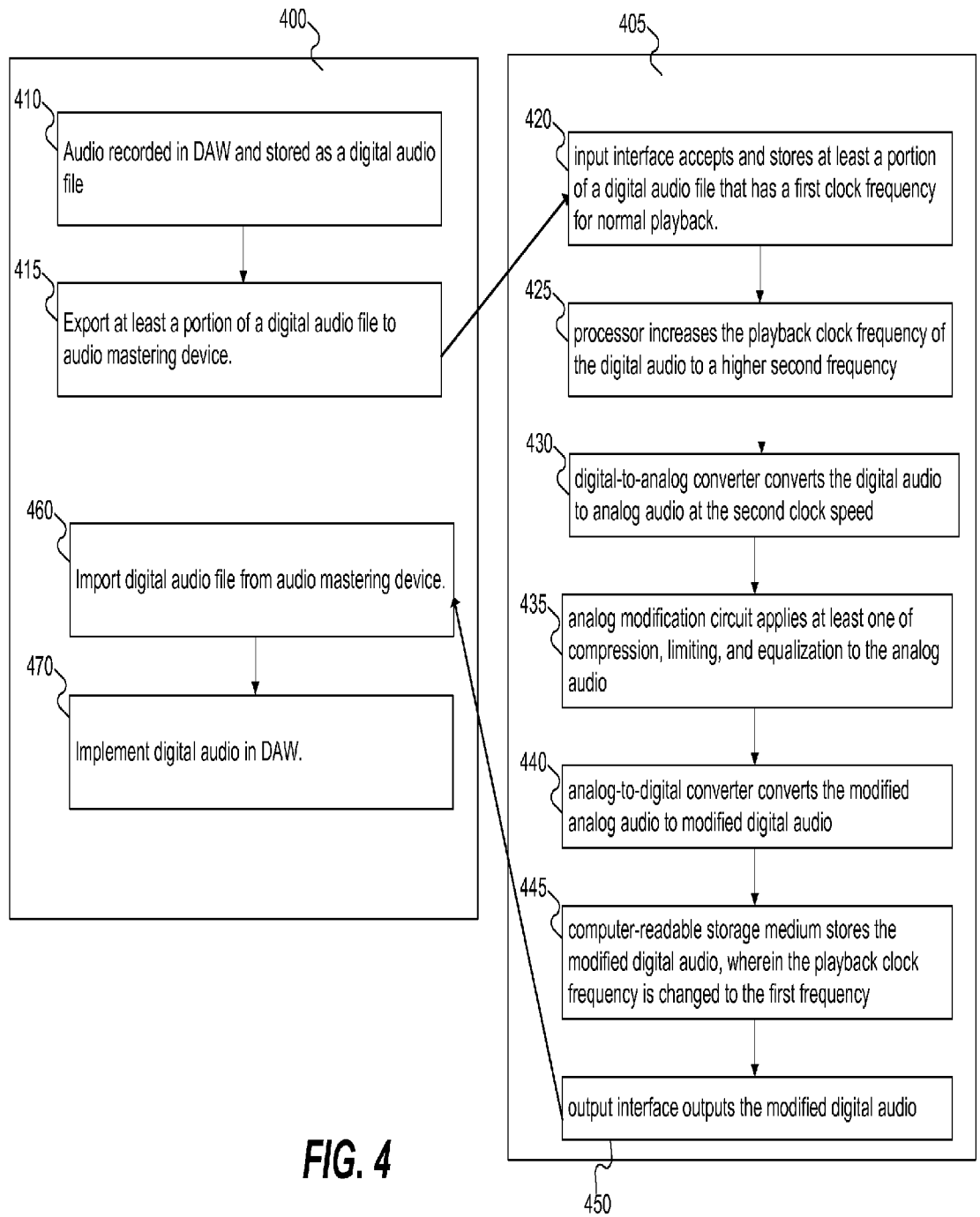
FIG. 4 is an exemplary flow chart with a non-exhaustive listing of steps that may be performed by a digital audio workstation and an audio processing device that interface with one another, in accordance with an embodiment.

FIG. 4 is an exemplary flow chart with a non-exhaustive listing of steps that may be performed by a digital audio workstation (DAW) and an audio processing device 205 while they interface with one another, in accordance with an embodiment.

In this example, box 400 contains a non-exhaustive listing of steps performed by the DAW. Box 405 contains a non-exhaustive listing of steps performed by the audio processing device.

At step 410, audio may be recorded in the DAW and stored as a digital audio file.

In one embodiment, the DAW receives input from the user to perform step 415, which includes exporting at least a portion of the digital audio file to the audio processing device. For example, the user may select a single track within the sequencing environment to export. Alternatively, the user may select just a portion of a single track to export. Still further, the user may select a mixdown of an entire mix to export.

In the example of FIG. 4, the digital audio file is exported prior to increasing the playback clock frequency of the digital audio file. However, in an alternate embodiment, the frequency is increased prior to exporting the digital audio file. In that alternate embodiment, the DAW may output a representation of the audio at the second clock frequency for modification, wherein the modification includes at least one of compression, equalization, and limiting. This representation can be analog in one embodiment, or digital in another embodiment.

At step 420, an input interface of the audio processing device 205 accepts and stores the digital audio file. The input interface can include an input port, receiver circuitry, and the processor, which may receive data according to a protocol recognized by the DAW.

At step 425, the processor increases the playback clock frequency of the digital audio to a higher second frequency. In this way, the audio processing device 205 may modify a digital audio file that normally has a first clock frequency for playback to instead have a second clock frequency that is higher than the first clock frequency. As mentioned above, this step may instead occur on the DAW in one embodiment.

At step 430, a digital-to-analog converter converts the digital audio file into analog audio while the digital audio file plays at the second clock speed.

At step 435, the analog signal is passed through the analog modification circuit, which applies at least one of compression, limiting, and equalization to the analog audio signal.

Then, at step 440, the analog-to-digital converter converts the modified analog audio into modified digital audio.

At step 445, that modified digital audio may be stored on a computer-readable storage medium, after which the playback clock frequency is changed to the first frequency. This storage medium may be located on the audio processing device 205 in one embodiment. In another embodiment, the computer-readable medium is located externally to the audio processing device.

At step 450, an output interface outputs the modified digital audio. In one embodiment, step 450 is performed in unison with step 445.

At step 460, the DAW imports the digital audio file form the audio processing device.

At step 470, the DAW implements the modified (i.e., manipulated) digital audio, which can include adding the modified digital audio file to a sequencer environment to replace or provide an alternative to the portion of the digital audio file initially exported to the audio processing device.

Figure 5:
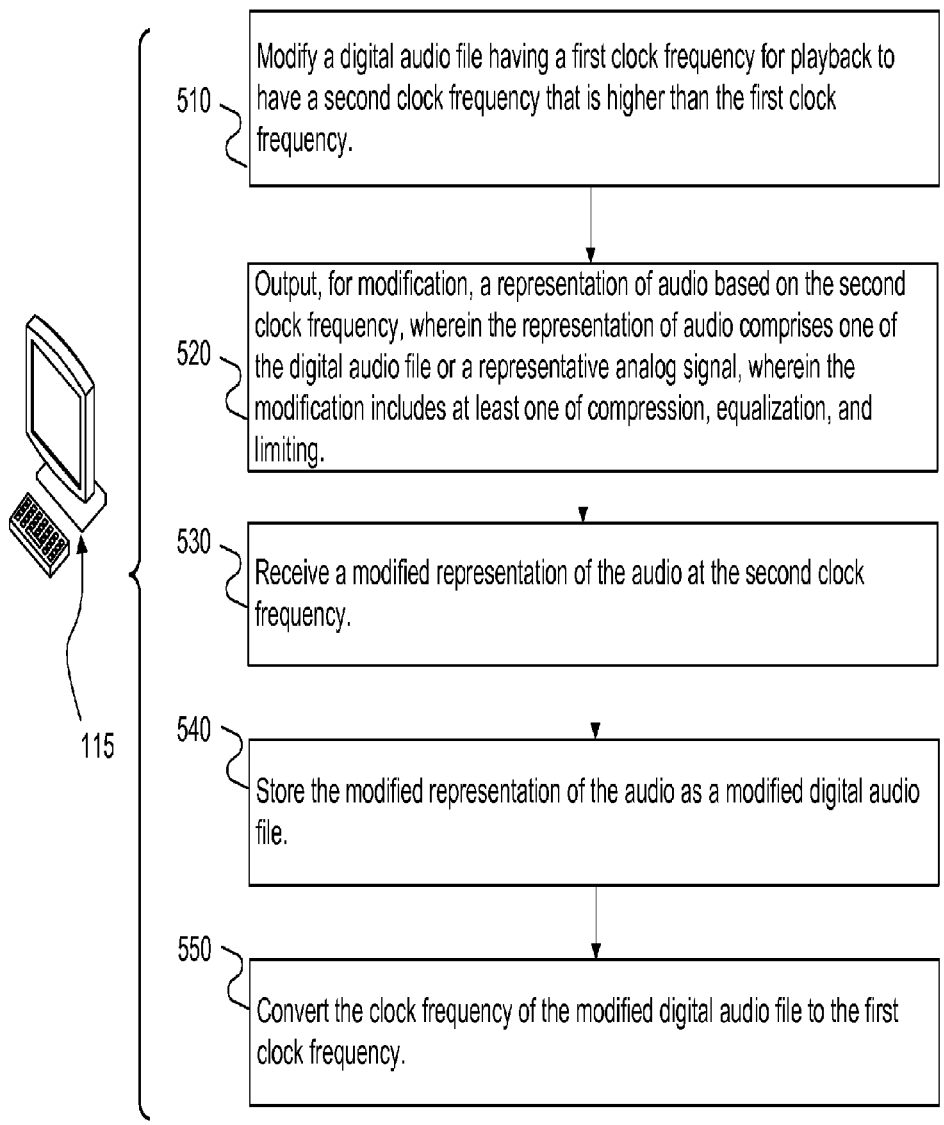
FIG. 5 is an exemplary flow chart with a non-exhaustive listing of steps that may be performed by a digital audio workstation (DAW).

Turning to FIG. 5, an exemplary flow chart is presented with a non-exhaustive listing of steps that may be performed by a digital audio workstation (DAW) 115.

At step 510, the DAW may modify a digital audio file having a first clock frequency for playback to have a second clock frequency that is higher than the first clock frequency.

At step 520, the DAW may output a representation of audio based on the second clock frequency for modification. For example, the representation may be digital in one embodiment, including reading the digital audio file at the second clock frequency. In another embodiment, the representation may be a representative audio signal, such as the audio signal resulting from performing a digital-to-analog conversion of the digital audio file by the DAW or an external converter in communication with the DAW.

The outputted representation may then be modified externally from the DAW.

This modification may include at least one of compression, equalization, and limiting, as previously discussed herein.

At step 530, after the representation of the audio is externally manipulated, the DAW may receive a modified representation of the audio at the second clock frequency. In one embodiment, the modified representation is a digital audio file. In another embodiment, the modified representation is an audio signal (e.g., the conversion may occur on the DAW).

At step 540, the DAW may store the modified representation of the audio as a modified digital audio file. If the modified representation is an analog signal, this step includes converting the analog signal into the modified digital audio file.

At step 550, the DAW may convert the clock frequency of the modified digital audio file to the first clock frequency for proper playback.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for remote analog mastering of digital audio files, the method comprising:
    importing, with a first digital audio workstation, a digital audio file;
    assigning, with the first digital audio workstation, a clock frequency to the digital audio file that is different from a playback frequency used for normal playback;
    converting, with a digital-to-analog converter, the digital audio file, played at the clock frequency, to an analog signal;
    manipulating, with one or more analog circuits, at least one sound characteristic of the analog signal;
    converting, with an analog-to-digital converter and after the manipulating, the analog signal to a second digital audio file;
    receiving, with a second digital audio workstation, the second digital audio file;
    assigning, at the second digital audio workstation, the playback frequency to the second digital audio file.

2. The method of claim 1, the importing comprising downloading the digital audio file to the first digital audio workstation.

3. The method of claim 1, further comprising delivering, with the second digital audio workstation, the second digital audio file to another non-transitory computer-readable storage medium.

4. The method of claim 3, the another non-transitory computer-readable storage medium comprising an externally located non-transitory computer-readable storage medium.

5. The method of claim 1, further comprising sharing, with the second digital audio workstation, the second digital audio file with a cloud computer.

6. The method of claim 1, the second digital audio file having a volume that is greater than that of the digital audio file.

7. The method of claim 1, the second digital audio file having a dynamic range that is less than that of the digital audio file.

8. The method of claim 1, wherein the first digital audio workstation, the digital-to-analog converter, the one or more analog circuits, the analog-to-digital converter, and the second digital audio workstation define an effects chain.

9. The method of claim 1, further comprising processing, with the second digital audio workstation, the second digital audio file in a digital domain.

10. The method of claim 1, wherein the clock frequency is higher than the playback frequency.

11. The method of claim 1, further comprising providing a link for downloading the digital audio file to a computer.

12. A method for mastering digital audio, the method comprising:
    obtaining, with one or more processors, a digital audio file having a normal clock frequency for normal playback;

modifying, with one or more circuits, a signal representation of digital audio file based on a clock frequency that is different than the normal clock frequency to obtain a modified signal representation, the modifying comprising one or more of compressing, equalizing, or limiting; and converting, with the one or more processors, the modified signal representation to the normal clock frequency.

13. The method of claim 12, further comprising downloading, with the one or more processors, the digital audio file.

14. The method of claim 12, the signal representation comprising a representative analog signal, further comprising converting the representative analog signal to another digital audio file after the modifying.

15. The method of claim 12, the one or more circuits comprising analog modules modeled in a digital domain.

16. The method of claim 12, further comprising sending the modified signal representation to a receiver device.

17. An audio processing device, comprising:

one or more processors to assign a clock frequency to a digital audio file that is different from a normal clock frequency used for playback;

a digital-to-analog converter to convert the digital audio file to analog audio at the clock frequency;

an analog modification circuit to apply one or more of compression, limiting, or equalization to the analog audio to obtain modified analog audio; and an analog-to-digital converter to convert the modified analog audio to modified digital audio;

the one or more processors further to assign the normal clock frequency to the modified digital audio.

18. The audio processing device of claim 17, further comprising an output to deliver the modified digital audio to one or more of a remote device or a non-transitory computer-readable storage medium.

19. The audio processing device of claim 17, further comprising an input interface to download at least a portion of the digital audio file.

20. The audio processing device of claim 19, the input interface to communicate with a remote device via a link to download the at least a portion of the digital audio file.

* * * * *